United States Patent
Kim (10) Patent No.: US 7,932,750 B2
(45) Date of Patent: Apr. 26, 2011

(54) DYNAMIC DOMINO CIRCUIT AND INTEGRATED CIRCUIT INCLUDING THE SAME

(75) Inventor: Min-Su Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 12/769,000

(22) Filed: Apr. 28, 2010

(65) Prior Publication Data

US 2010/0315125 A1 Dec. 16, 2010

(51) Int. Cl.
*H03K 19/00* (2006.01)
(52) U.S. Cl. ............................ 326/93; 326/46; 326/112
(58) Field of Classification Search .................... 326/46, 326/93–98, 112, 119, 121
See application file for complete search history.

(56) References Cited

U.S. PATENT DOCUMENTS

| | | | | |
|---|---|---|---|---|
| 5,910,742 A | * | 6/1999 | Synder et al. | ................. 327/165 |
| 5,983,013 A | | 11/1999 | Rogers et al. | |
| 6,018,254 A | * | 1/2000 | Rogers et al. | ................... 326/96 |

FOREIGN PATENT DOCUMENTS

| | | |
|---|---|---|
| JP | 2001-244806 | 9/2001 |
| JP | 2006-253242 | 9/2006 |
| KR | 10-0293261 | 4/2001 |

* cited by examiner

*Primary Examiner* — Don P Le
(74) *Attorney, Agent, or Firm* — Stanzione & Kim, LLP (57) ABSTRACT

A dynamic domino circuit includes a clock generator and a domino circuit. The clock generator generates a pulse signal and a plurality of internal clock signals based on a global clock signal. Phases of the plurality of internal clock signals are sequentially delayed. The domino circuit sequentially performs a plurality of logic operations based on a plurality of input signals, the pulse signal and the plurality of internal clock signals and generates an output signal in synchronization with the pulse signal. The dynamic domino circuit may provide an effective interface with static logics.

20 Claims, 8 Drawing Sheets

DYNAMIC DOMINO CIRCUIT AND INTEGRATED CIRCUIT INCLUDING THE SAME

CROSS-REFERENCE TO RELATED APPLICATIONS

This application claims the benefit of priority under 35 USC §119 to Korean Patent Application No. 2009-0053307, filed on Jun. 16, 2009 in the Korean Intellectual Property Office (KIPO), the contents of which are herein incorporated by reference in their entirety.

BACKGROUND

1. Field of the Invention

Example embodiments relate to a dynamic circuit, and more particularly to a high speed dynamic domino circuit and an integrated circuit including the same.

2. Description of the Related Art

A dynamic circuit is widely used to design and manufacture a high speed integrated circuit. However, uses of the dynamic circuit in integrated circuits in portable devices may be limited because the dynamic circuit may consume relatively more power than static circuits. In addition, when the dynamic circuit is used in an integrated circuit including static logic, the operation speed of a path including the dynamic circuit may increase, but additional logic circuits are required to provide an input/output (I/O) interface between the dynamic circuit and the static logic. Thus, it is difficult to increase the overall operation speed of the integrated circuit including the dynamic circuit.

SUMMARY

Accordingly, the present general inventive concept is provided to substantially obviate one or more problems due to limitations and disadvantages of the related art.

Additional features and utilities of the present general inventive concept will be set forth in part in the description which follows and, in part, will be obvious from the description, or may be learned by practice of the general inventive concept.

Some example embodiments provide a dynamic domino circuit configured to provide an effective interface with a static logic and improve the operation speed and the reliability thereof.

Some example embodiments provide an integrated circuit including the dynamic domino circuit.

In some example embodiments of the general inventive concept, a dynamic domino circuit includes a clock generator and a domino circuit. The clock generator generates a pulse signal and a plurality of internal clock signals based on a global clock signal. Phases of the plurality of internal clock signals may be sequentially delayed. The domino circuit may sequentially perform a plurality of logic operations based on a plurality of input signals, the pulse signal, and the plurality of internal clock signals, and may generate an output signal in synchronization with the pulse signal.

In some embodiments, each of duty ratios of the plurality of internal clock signals may be greater than about 0.5.

In some embodiments, the domino circuit may include a plurality of dynamic units. The plurality of dynamic units may be cascade-coupled from a first-stage dynamic unit to a last-stage dynamic unit. Each of the plurality of dynamic units may perform a respective logic operation based on an output signal of a previous-stage dynamic unit and may output a result of the logic operation to a next-stage dynamic unit. A dynamic unit disposed at a later stage may receive an internal clock signal having a more delayed phase than a dynamic unit located in a previous stage.

The first-stage dynamic unit may output the result of the logic operation to a second-stage dynamic unit in synchronization with the pulse signal.

The dynamic domino circuit may further include a pulse latch. The pulse latch may latch an output signal of the last-stage dynamic unit in synchronization with the pulse signal to generate the output signal in synchronization with the pulse signal.

The pulse latch may include a tri-state inverter. The tri-state inverter may receive the output signal of the last-stage dynamic unit and may perform a switching operation in response to the pulse signal.

Each of the plurality of dynamic units may include a pre-charge transistor, a discharge transistor, and a logic unit.

The pre-charge transistor may be connected between a source voltage and a first node. The discharge transistor may be connected between a ground voltage and a second node. The logic unit may be connected between the first node and the second node.

The logic unit may include a plurality of low threshold-voltage transistors to perform a switching operation at a relatively high speed. The pre-charge transistor and the discharge transistor may have a threshold voltage higher than a threshold voltage of the low threshold-voltage transistor to reduce a leakage current.

The first-stage dynamic unit may include a first pre-charge transistor, a first discharge transistor, and a first logic unit. The first-stage dynamic unit may output the result of the logic operation of the first logic unit in synchronization with the pulse signal that is applied to a gate of the first discharge transistor.

The clock generator may include a delay-inversion unit and a clock output unit.

The delay-inversion unit may generate an inverted clock signal by inverting the global clock signal, may generate a delayed-inverted clock signal by delaying the inverted clock signal, and may generate a delayed clock signal by inverting the delayed-inverted clock signal. The clock output unit may perform the logic operation on the inverted clock signal, the delayed-inverted clock signal, and the delayed clock signal to generate the pulse signal and the plurality of internal clock signals.

The clock output unit may include a first unit, a second unit, a third unit, and a fourth unit. The first unit may perform an AND operation on the global clock signal and the delayed-inverted clock signal to generate the pulse signal. The second unit may perform an OR operation on the global clock signal and the delayed clock signal to generate a first internal clock signal. The third unit may perform the OR operation on the inverted clock signal and the delayed clock signal to generate a second internal clock signal. The fourth unit may perform the OR operation on the inverted clock signal and the delayed-inverted clock signal to generate a third internal clock signal.

In some example embodiments of the inventive concept, an integrated circuit includes a first circuit, a dynamic domino circuit, and a second circuit.

The first circuit receives a global clock signal and is configured to provide a plurality of input signals. The dynamic domino circuit generates a pulse signal and a plurality of internal clock signals based on the global clock signal, sequentially performs a plurality of logic operations based on the plurality of input signals, the pulse signal, and the plurality of internal clock signals, and generates an output signal in synchronization with the pulse signal. Phases of the plurality of internal clock signals are sequentially delayed. The second circuit receives the global clock signal and the output signal in synchronization with the pulse signal.

The dynamic domino circuit may include a clock generator and a domino circuit.

The clock generator may generate the pulse signal and the plurality of internal clock signals based on the global clock signal. The domino circuit may sequentially perform the plurality of logic operations based on the plurality of input signals, the pulse signal and the plurality of internal clock signals and may generate the output signal in synchronization with the pulse signal.

Accordingly, in the dynamic domino circuit according to some example embodiments, an effective interface with a static logic may be provided and thus the operation speed of the integrated circuit that includes the dynamic domino circuit may be improved.

The dynamic domino circuit according to the example embodiments may effectively control the phases and duty ratios of the internal clock signals, to thereby prevent erroneous operations and improve the reliability thereof. In addition, in the dynamic domino circuit according to the example embodiments, power consumption may be reduced, whereas the operation speed may not be reduced.

Features and/or utilities of the present general inventive concept may also be realized by a dynamic domino circuit including a clock generator to receive a global clock signal and to output a pulse signal and a plurality of internal clock signals, the internal clock signals having phases different from each other, and a domino circuit including a plurality of logic units connected in series, such that each logic unit receives as an input signal an output from an immediately-preceding logic unit in the domino circuit, and a logic operation of each logic unit is performed according to a respective internal clock signal supplied to the respective logic unit.

A first logic unit located upstream in the domino circuit with respect to a second logic unit may receive an internal clock signal of the plurality of internal clock signals having a phase having a delay less than that of an internal clock signal supplied to the second logic unit.

The clock generator may include at least one delay circuit to receive a first clock signal corresponding to the global clock signal and to output a second clock signal having a phase delay with respect to the first signal. The internal clock signal supplied to the first logic unit may correspond to the first clock signal, and the internal clock signal supplied to the second logic unit may correspond to the second clock signal.

The clock generator further may include a first inverter to receive the global clock signal and to output an inverted clock signal as the first clock signal, and a second inverter to receive the second clock signal and to output a third clock signal. Internal clock signals corresponding to the first, second, and third clock signals may be supplied to respective logic units of the dynamic domino circuit, such that an internal clock signal corresponding to the third clock signal is supplied to a logic unit downstream of the second logic unit in the dynamic domino circuit.

The dynamic domino circuit may further include a clock output unit to receive the global clock signal and the first, second, and third clock signals and to output the pulse signal and the plurality of internal clock signals.

The clock output unit may include a NAND logic circuit to receive the global clock signal and the second clock signal and to output the pulse signal, a first NOR logic circuit to receive the global clock signal and the third clock signal and to output a first internal clock signal of the plurality of internal clock signals, a second NOR logic circuit to receive the first clock signal and the third clock signal and to output a second internal clock signal of the plurality of internal clock signals, and a third NOR logic circuit to receive the first clock signal and the second clock signal and to output a third internal clock signal of the plurality of internal clock signals.

An output of the last logic unit of the plurality of logic units connected in series may be synchronized with the pulse signal.

The dynamic domino circuit may include a latch circuit to latch the output of the last logic unit of the plurality of logic units to the output of the latch in synchronization with the pulse signal.

Features and/or utilities of the present general inventive concept may also be realized by an integrated circuit including a first circuit to receive a global clock signal and to generate a plurality of input signals, and a dynamic domino circuit to receive the global clock signal and the plurality of input signals and to output an output signal. The dynamic domino circuit may include a clock generator to receive the global clock signal and to output a pulse signal and a plurality of internal clock signals, the internal clock signals having phases different from each other, and a domino circuit including a plurality of logic units connected in series, such that each logic unit may receive as an input signal an output from an immediately-preceding logic unit in the domino circuit and at least one of the input signals from the first circuit, and a logic operation of each logic unit is performed according to a respective internal clock signal supplied to the respective logic unit. An output of the dynamic domino circuit may be synchronized with the pulse signal.

BRIEF DESCRIPTION OF THE DRAWINGS

The above and/or other features of the present general inventive concept will become apparent and more readily appreciated from the following description of the exemplary embodiments, taken in conjunction with the accompanying drawings, in which.

DETAILED DESCRIPTION OF THE EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures. This general inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the general inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which this inventive concept pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
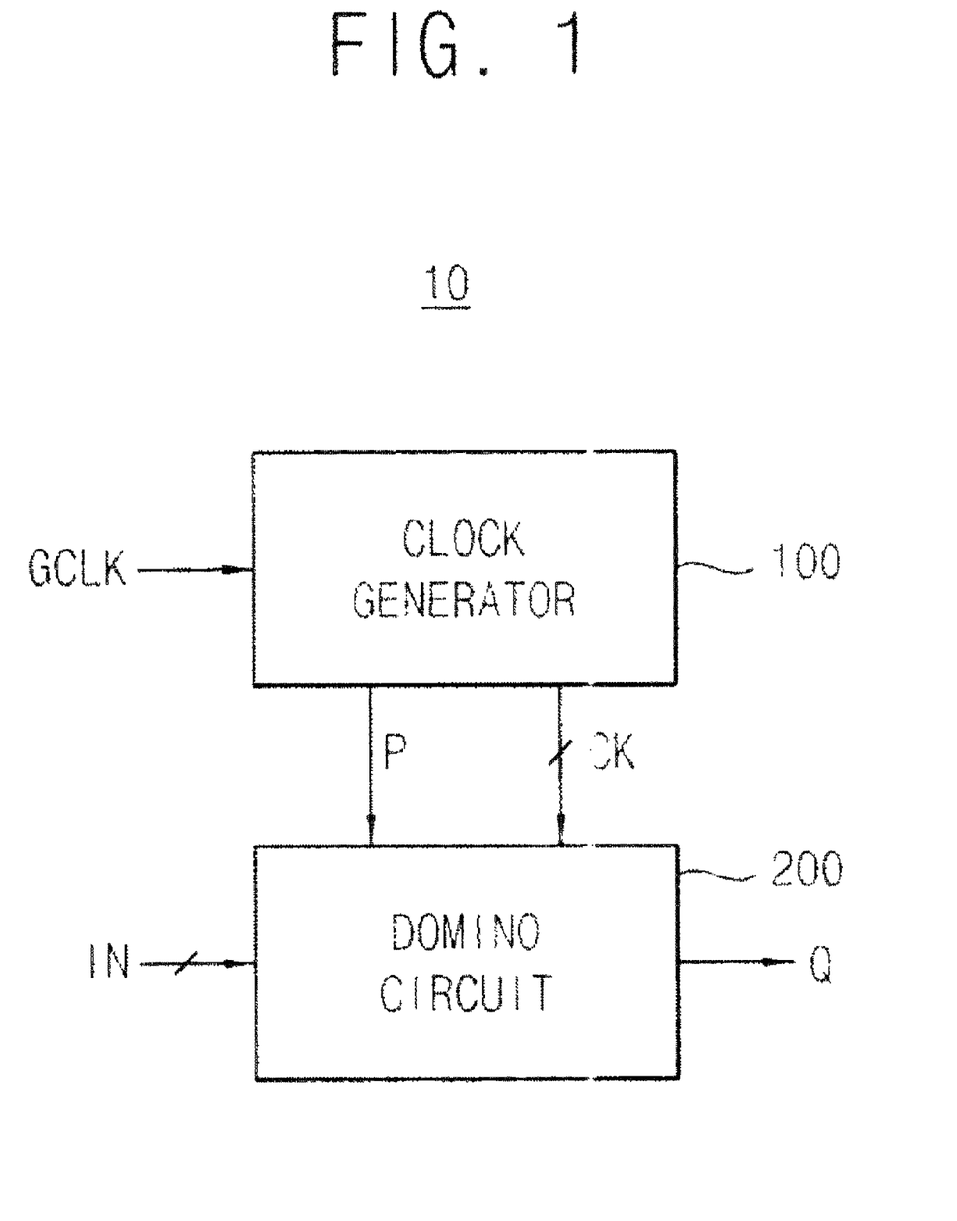
FIG. 1 is a block diagram illustrating a dynamic domino circuit according to some example embodiments of the present general inventive concept.

FIG. 1 is a block diagram illustrating a dynamic domino circuit 10 according to some example embodiments.

Referring to FIG. 1, the dynamic domino circuit 10 includes a clock generator 100 and a domino circuit 200.

The clock generator 100 generates a pulse signal P and a plurality of internal clock signals CK based on a global clock signal GCLK. The phases of the plurality of internal clock signals CK are sequentially delayed. The domino circuit 200 sequentially performs a plurality of logic operations based on a plurality of input signals IN, the pulse signal P and the plurality of internal clock signals CK and generates an output signal Q in synchronization with the pulse signal P. The global clock signal GCLK may be a clock signal that is commonly used in an integrated circuit including the dynamic domino circuit 10 to synchronize various circuits in the integrated circuit.

For example, the plurality of input signals IN may be static signals and may be provided from other circuits included in the integrated circuit to the dynamic domino circuit 10. The output signal Q may be the static signal and may be provided to the other circuits. The dynamic domino circuit 10 may be effectually merged with static logic circuits. The dynamic domino circuit 10 internally transmits dynamic signals from a first internal unit to a last internal unit and performs an input operation and/or an output operation in relation with the other static logics.

A C-to-Q delay, which indicates a time interval from a timing point when a clock signal is received to a timing point when an output signal is provided, may have little influence on a static signal, such as a scan test input signal. However, in a pipeline circuit or a domino circuit including a plurality of dynamic circuits, the dynamic signals are required to be rapidly sampled or estimated. In other words, the domino circuit needs to rapidly provide the output signal of each stage to a next stage, in order to sequentially perform the plurality of logic operations or a plurality of transmission operations within a single clock period.

Conventional domino circuits may have a high operation speed, but may not be appropriate for a portable device requiring low power consumption. Also, benefits of the high-speed operation may be nullified if the conventional domino circuits are merged with the static logic circuits.

In contrast, the dynamic domino circuit 10 according to the example embodiments may be effectually merged with the static logics by performing input/output (I/O) operation in synchronization with the pulse signal P. The static logic included in a critical pipeline stage may be substituted with the dynamic logic, such as the dynamic domino circuit 10 of FIG. 1, to thereby improve the operation speed and reduce the power consumption.

Figure 2:
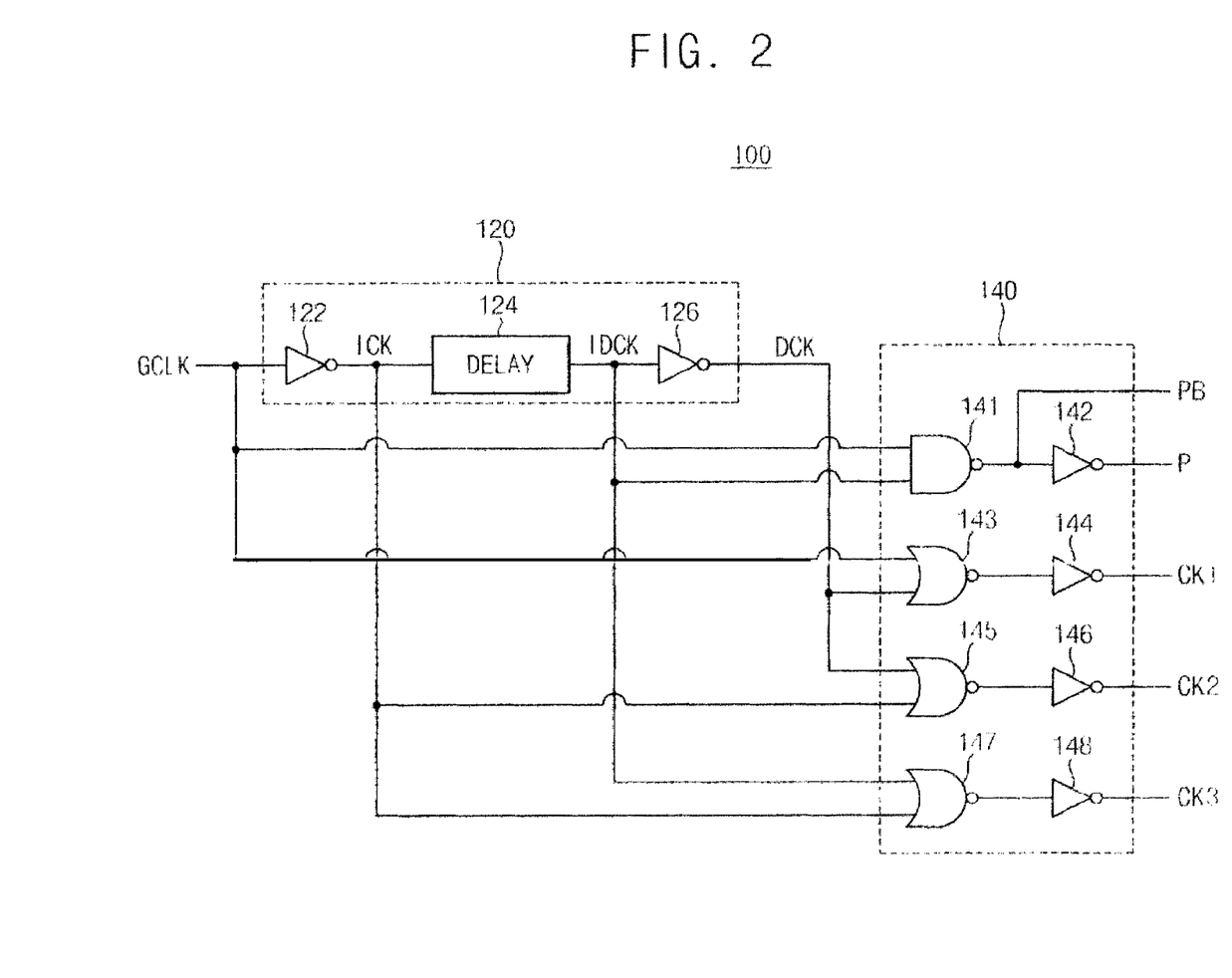
FIG. 2 is a circuit diagram illustrating an example of a clock generator included in the dynamic domino circuit of FIG. 1.

FIG. 2 is a circuit diagram illustrating an example of a clock generator 100 included in the dynamic domino circuit 10 of FIG. 1.

Referring to FIG. 2, the clock generator 100 may include a delay-inversion unit 120 and a clock output unit 140.

The delay-inversion unit 120 generates an inverted clock signal ICK by inverting the global clock signal GCLK, generates a delayed-inverted clock signal IDCK by delaying the inverted clock signal ICK, and generates a delayed clock signal DCK by inverting the delayed-inverted clock signal IDCK. In an example embodiment, the delay-inversion unit 120 may include a first inverter 122, a delay unit 124, and a second inverter 126 as illustrated in FIG. 2. The first inverter 122 inverts the global clock signal GCLK to output the inverted clock signal ICK. The delay unit 124 delays the inverted clock signal ICK to output the delayed-inverted clock signal IDCK. The second inverter 126 inverts the delayed-inverted clock signal IDCK to output the delayed clock signal DCK. The delay unit 124 may be implemented with the even number of inverters that are connected in series or may be implemented using a plurality of resistors, for example.

Hereinafter, it is assumed that all of elements included in the dynamic domino circuit 10, such as the first and second inverters 122 and 126, except for the delay unit 124, may not have a delay time. Actually, for example, when the signals are inverted through the first and second inverters 122 and 126, each of the inverters 122 and 126 may output the inverted signal that is delayed by a predetermined time. However, the delay times of the inverters 122 and 126 may be much shorter than the delay time of the delay unit 124. Thus, the delay times of all elements, except for the delay time generated by the delay unit 124, will be omitted from the description below.

The clock output unit 140 performs a logic operation on the inverted clock signal ICK, the delayed-inverted clock signal IDCK and the delayed clock signal DCK to generate the pulse signal P and the plurality of internal clock signals CK.

In an example embodiment, the clock output unit 140 may include a first unit, a second unit, a third unit, and a fourth unit.

The first unit performs an AND operation on the global clock signal GCLK and the delayed-inverted clock signal IDCK to generate the pulse signal P and an inversion signal PB of the pulse signal P. The first unit may include an NAND gate 141 and an inverter 142.

The second unit performs an OR operation on the global clock signal GCLK and the delayed clock signal DCK to generate a first internal clock signal CK1. The second unit may include an NOR gate 143 and an inverter 144.

The third unit performs the OR operation on the inverted clock signal ICK and the delayed clock signal DCK to generate a second internal clock signal CK2. The third unit may include an NOR gate 145 and an inverter 146.

The fourth unit performs the OR operation on the inverted clock signal ICK and the delayed-inverted clock signal IDCK to generate a third internal clock signal CK3. The fourth unit may include an NOR gate 147 and an inverter 148.

Figure 3:
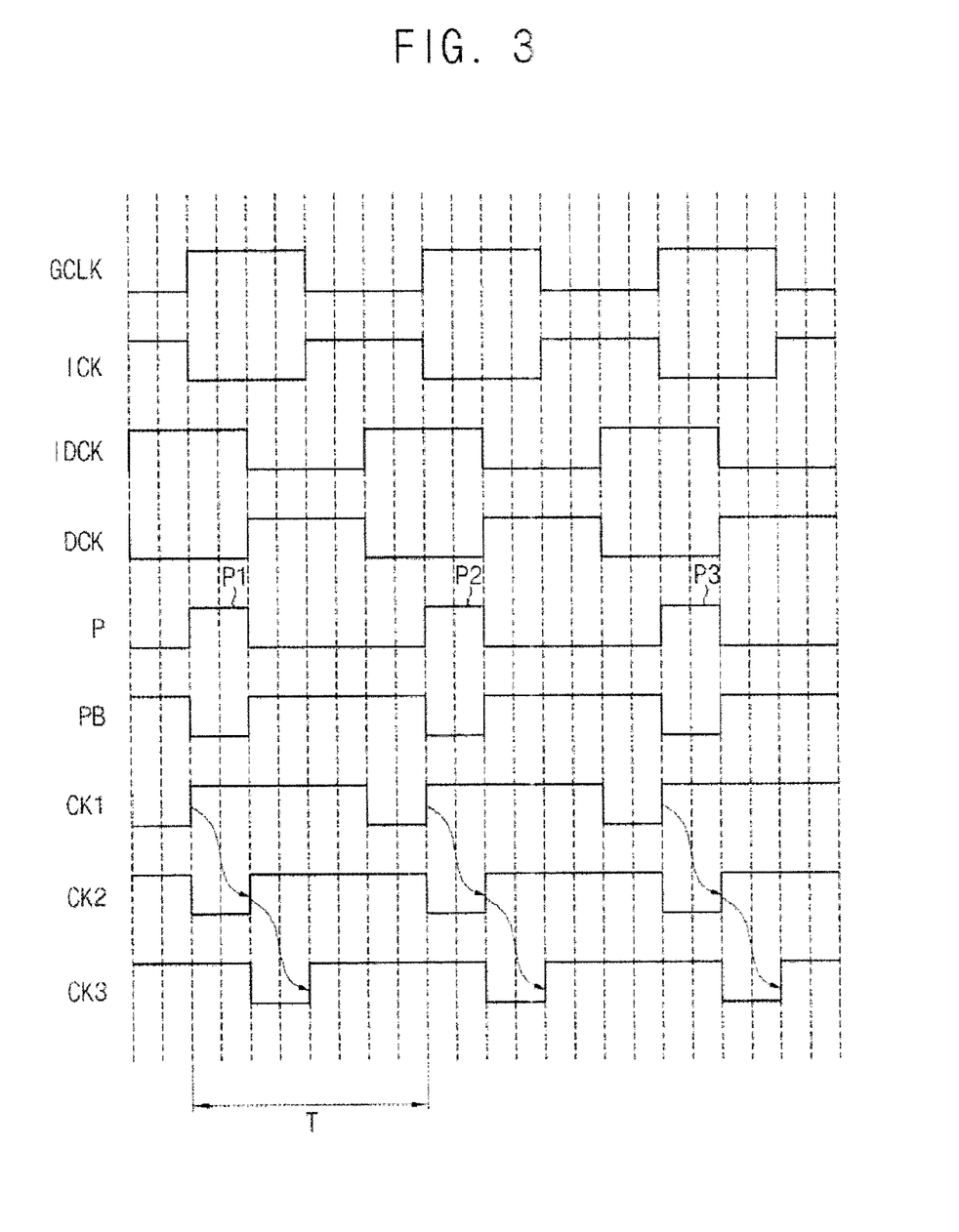
FIG. 3 is a timing diagram illustrating an operation of the clock generator of FIG. 2.

FIG. 3 is a timing diagram illustrating an operation of the clock generator 100 of FIG. 2.

In FIG. 3, GCLK, ICK, IDCK and DCK indicate the global clock signal, the inverted clock signal, the delayed-inverted clock signal and the delayed clock signal, respectively. The inverted clock signal ICK, the delayed-inverted clock signal IDCK and the delayed clock signal DCK may be generated from the clock generator 100 based on the global clock signal GCLK. P, PB, CK1, CK2, CK3 indicate the pulse signal, the inversion signal of the pulse signal, the first internal clock signal, the second internal clock signal, and the third internal clock signal, respectively. The pulse signal P, the inversion signal PB of the pulse signal P, the first internal clock signal CK1, the second internal clock signal CK2, and the third internal clock signal CK3 may be generated from the clock generator 100 based on the global clock signal GCLK, the inverted clock signal ICK, the delayed-inverted clock signal IDCK, and the delayed clock signal DCK and may be provided to the domino circuit 200.

In an example embodiment, the delay time interval of the delay unit 124 of FIG. 2 may be a quarter of a clock period T of the internal clock signals CK1, CK2 and CK3, as illustrated in FIG. 3. However, the delay time interval is not limited to a quarter of a clock period T, and may be adjusted to any desired interval by adjusting the components of the delay unit 124.

Referring to FIG. 3, the phases of the internal clock signals CK1, CK2 and CK3 are sequentially delayed. For example, the phase of the second internal clock signal CK2 lags the phase of the first internal clock signal CK1 by the delay time interval of the delay unit 124. The phase of the third internal clock signal CK3 lags the phase of the second internal clock signal CK2 by the delay time interval of the delay unit 124. Each of duty ratios of the internal clock signals CK1, CK2 and CK3 may be greater than about 0.5. The duty ratio may be defined as a ratio of a duration time of logic high level of a clock signal over a clock period of the clock signal. The pulse signal P includes pulses P1, P2 and P3 such that a duty ratio of the pulse signal P may be smaller than about 0.5. The clock period T of the internal clock signals CK1, CK2 and CK3 and the pulse signal P may be substantially same as a clock period of the global clock signal GCLK.

As such, the clock generator 100 may control the phase delays and the duty ratios of the internal clock signals CK1, CK2, CK3 and may increase a phase overlap time interval during which two of the internal clock signals are superimposed in phase. The phase overlap time interval may be increased to about a half of the clock period T of the internal clock signals CK1, CK2 and CK3. Thus, the increase of the phase overlap time interval may enhance an operational margin, may prevent erroneous operations due to an on chip variation (OCV) related with manufacturing processes and may improve the reliability of the dynamic domino circuit 10.

Figure 4:
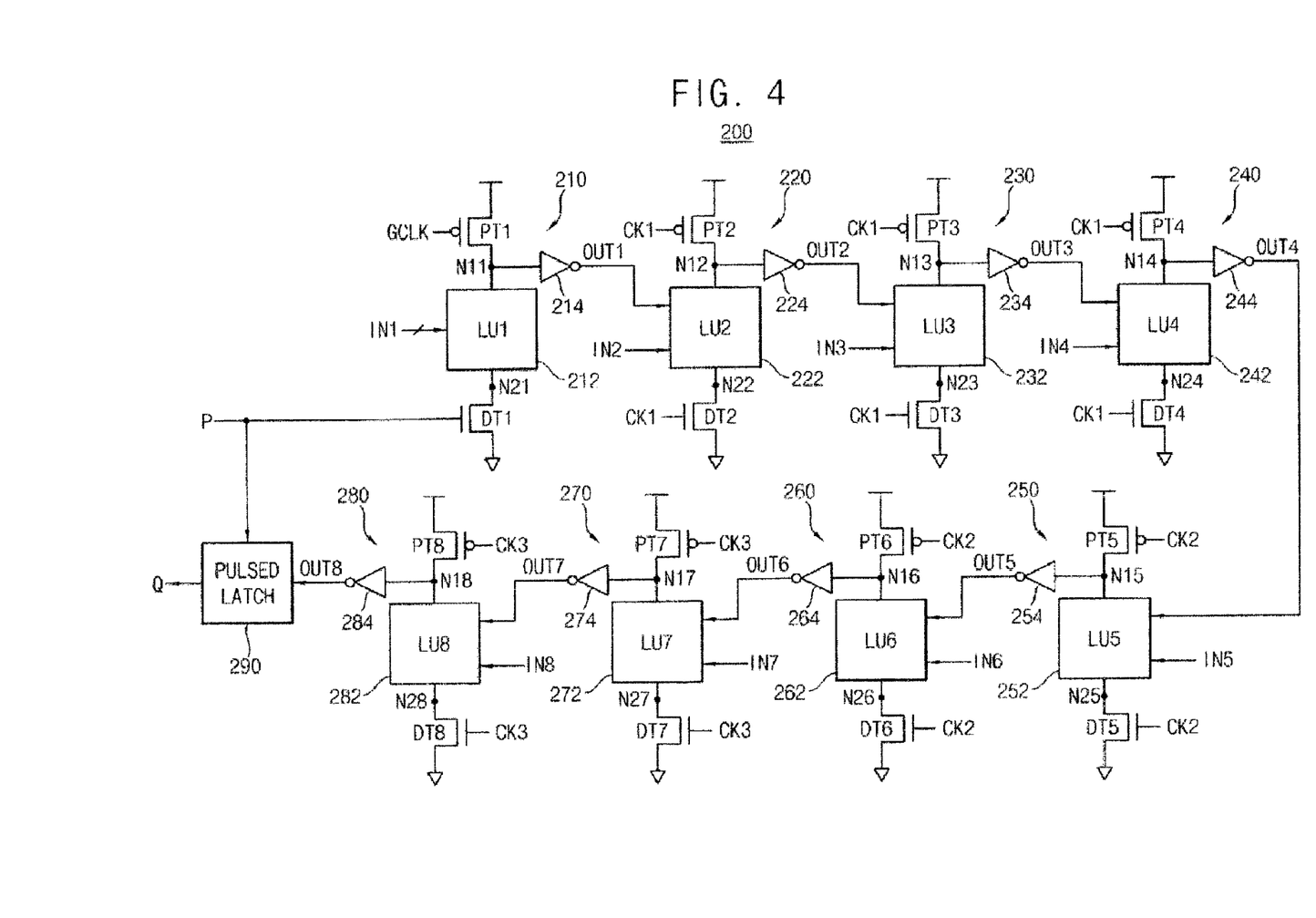
FIG. 4 is a circuit diagram illustrating an example of a domino circuit included in the dynamic domino circuit of FIG. 1.

FIG. 4 is a circuit diagram illustrating an example of a domino circuit 200 included in the dynamic domino circuit 10 of FIG. 1.

Referring to FIG. 4, the domino circuit 200 may include a plurality of the dynamic units 210, 220, 230, 240, 250, 260, 270, and 280. Although FIG. 4 illustrates the domino circuit 200 including eight dynamic units, the number of dynamic units is not limited thereto. The plurality of the dynamic units 210 through 280 is cascade-coupled from a first-stage dynamic unit 210 to a last-stage dynamic unit 280. Each of the dynamic units 210 through 280 performs the logic operation based on an output signal of a previous-stage dynamic unit and outputs a result of the logic operation to a next-stage dynamic unit. For example, a third dynamic unit 230 may perform the logic operation based on an output signal OUT2 of a second dynamic unit 220 and a corresponding input signal IN3, and may provide an output signal OUT3 indicating the result of the logic operation to a fourth dynamic unit 240.

In the domino circuit 200 of FIG. 4, a dynamic unit disposed at a later-stage may receive an internal clock signal having a more delayed phase. For example, as illustrated in FIG. 4, the second dynamic unit 220, the third dynamic unit 230, and the fourth dynamic unit 240 may receive the first internal clock signal CK1, respectively. A fifth dynamic unit 250 and a sixth dynamic unit 260 may receive the second internal clock signal CK2, respectively. A seventh dynamic unit 270 and an eighth dynamic unit 280 may receive the third internal clock signal CK3, respectively. The number of the dynamic units that receive same internal clock signal may be varied in other example embodiments.

The first-stage dynamic unit 210 estimates the result of the logic operation of the logic unit LU1 in synchronization with the pulse signal P and outputs the determined result to a second-stage dynamic unit 220.

In an example embodiment, the domino circuit 200 may further include a pulse latch 290. The pulse latch 290 latches an output signal of the last-stage dynamic unit 280 to generate output signal Q.

In an example embodiment, each of the dynamic units 210 through 280 may include a pre-charge transistor PTi, a discharge transistor DTi and a logic unit LUi, where i is a natural number less than or equal to eight to correspond to the respective dynamic units 210, 220, 230, 240, 250, 260, 270, and 280. Each pre-charge transistor PTi is connected between a source voltage VDD and each first node N1$i$. Each discharge transistor DTi is connected between a ground voltage and each second node N2$i$. Each logic unit LUi is connected between each first node N1$i$ and each second node N2$i$. For example, the third dynamic unit 230 includes a third pre-charge transistor PT3, a third discharge transistor DT3, and a third logic unit (LU3) 232. The third pre-charge transistor PT3 is connected between the source voltage VDD and a first node N13, the third discharge transistor DT3 is connected between the ground voltage and a second node N23, and the third logic unit LU3 is connected between the first node N13 and the second node N23.

The first-stage dynamic unit 210 may include a first pre-charge transistor PT1, a first discharge transistor DT1 and a first logic unit (LU1) 212. A gate of the first discharge transistor DT1 may receive the pulse signal P and a gate of the first pre-charge transistor PT1 may receive the global clock signal GCLK. The first-stage dynamic unit 210 may output the result of the logic operation of the first logic unit 212 to the second dynamic unit 220 in synchronization with the pulse signal P.

Each logic unit LUi may include a plurality of low threshold-voltage transistors that may perform switching operations at a relatively high speed. Each pre-charge transistor PTi and each discharge transistor DTi may have a threshold voltage higher than a threshold voltage of the low threshold-voltage transistor to reduce a leakage current. For example, each pre-charge transistor PTi and each discharge transistor DTi may be a regular threshold-voltage transistor or a high threshold-voltage transistor.

Figure 5:
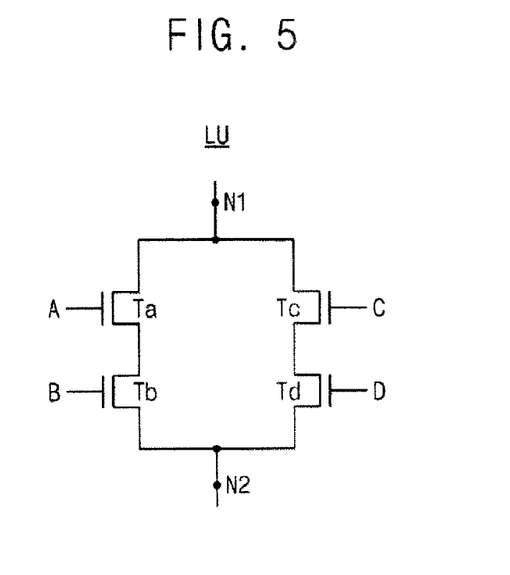
FIG. 5 is a circuit diagram illustrating an example of a logic unit included in the domino circuit of FIG. 4.

FIG. 5 is a circuit diagram illustrating an example of a logic unit LU included in the domino circuit 200 of FIG. 4.

Referring to FIG. 5, the logic unit LU may include a plurality of N-type metal oxide semiconductor (NMOS) transistors Ta, Tb, Tc and Td. The NMOS transistors Ta, Tb, Tc and Td are coupled between a first node N1 and a second node N2.

FIG. 5 illustrates an example of one of the logic units 212, 222, 232, 242, 252, 262, 272, and 282 of FIG. 4. However, the logic units 212 through 282 of FIG. 4 may have various structures depending on the logic operation thereof.

Referring to FIG. 5, the logic unit LU includes four NMOS transistors Ta, Tb, Tc, and Td. The logic unit LU receives four input signals A, B, C, and D to perform the logic operation, such as ((A AND B) OR (C AND D)). The logic unit LU of FIG. 5 may perform an AND operation on the signals A and B to generate a first AND signal, may perform the AND operation on the signals C and D to generate a second AND signal, and then may perform an OR operation on the first AND signal and the second AND signal. At least one of the signals A, B, C, and D may be the output signal of the previous-stage dynamic unit.

When a logic level of the result of the logic operation ((A AND B) OR (C AND D)) corresponds to logic high level, conduction path is formed between the first node N1 and the second node N2. The first node N1 may be discharged to logic low level when the discharge transistor DTi coupled to the second node N2 is turned on.

In contrast, when the logic level of the result of the logic operation ((A AND B) OR (C AND D)) corresponds to logic low level, the conduction path is not formed between the first node N1 and the second node N2. The first node N1 may be maintained in pre-charged logic high level even though the discharge transistor DTi coupled to the second node N2 is turned on.

As such, each of the dynamic units 210 through 280 of FIG. 4 estimates each of the results of the logic operations of the logic units 212 through 282 based on the discharging operation and sequentially provides each of the estimation results to the next-stage dynamic unit.

Figure 6:
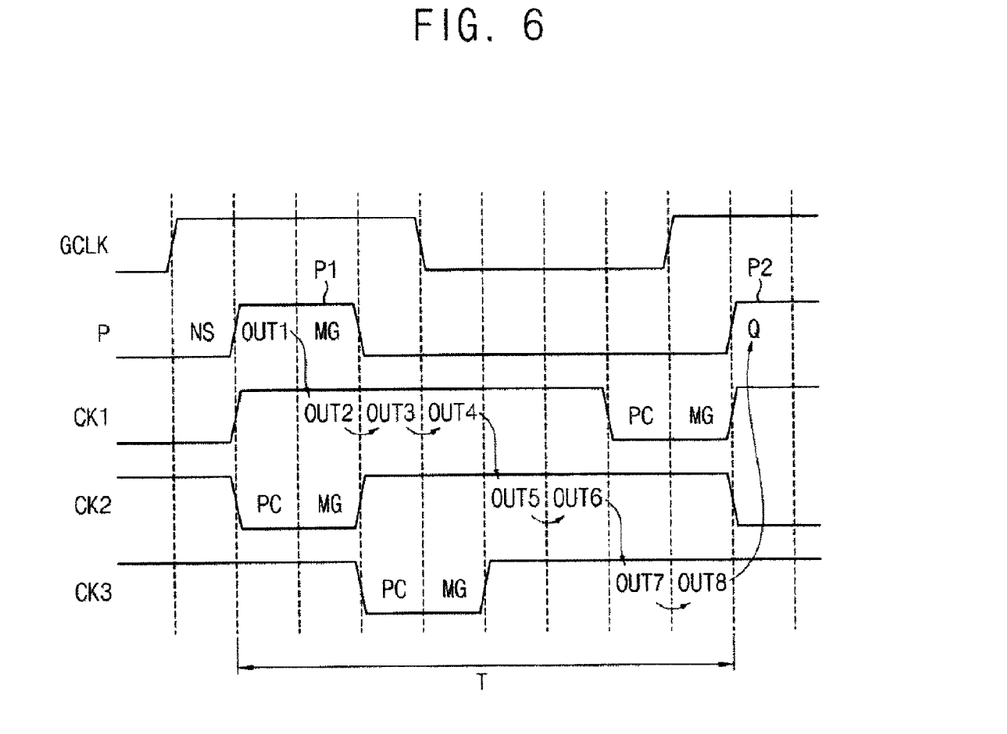
FIG. 6 is a timing diagram illustrating an operation of the domino circuit of FIG. 4.

FIG. 6 is a timing diagram illustrating an operation of the domino circuit 200 of FIG. 4.

In FIG. 6, GCLK, P, CK1, CK2, and CK3 indicate the global clock signal, the pulse signal, the first internal clock signal, the second internal clock signal, and the third internal clock signal, respectively. NS indicates a negative setup time and each of OUT1, OUT2, OUT3, OUT4, OUT5, OUT6, OUT7, and OUT8 indicates a time point at which each of dynamic units 210 through 280 outputs each of the estimation results. The negative setup time NS may be determined by adjusting the delay time of the clock output unit 140 of the FIG. 2. MG indicates the operational margin to reduce the influence of OCV, PC indicates the pre-charge operation time, and Q indicates a time point at which the domino circuit 200 provides the output signal in synchronization with the pulse signal P.

As illustrated in FIG. 6, each of the dynamic unit 210 through 280 may perform the pre-charge operation during a period of time when each of the logic levels of internal clock signals CK1, CK2, and CK3 applied to the each pre-charge transistor PTi, and each discharge transistor DTi is at a logic low level. Each of the dynamic unit 210 through 280 may perform the discharge operation during a period of time when each of the logic levels of internal clock signals CK1, CK2, and CK3 is at a logic high level. The discharge operation may be performed by determining the result of each of the logic operations. Thus, the domino circuit 200 may generate the output signal Q within the clock period T of the internal clock signals CK1, CK2, and CK3.

The first-stage dynamic unit 210 provides the first output signal OUT1 in synchronization with the first pulse P1 of the pulse signal P and the pulse latch 290 latches the output signal OUT8 of the last-stage dynamic unit 280 in synchronization with the second pulse P2 of the pulse signal P. Thus, the dynamic domino circuit 10 may perform the input operation and the output operation within a single clock period of the global clock signal GCLK and may provide an effective interface with the other static logic circuits.

Figure 7:
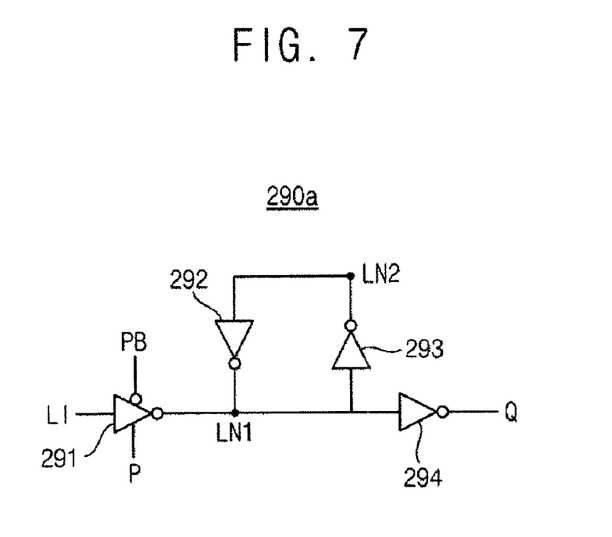
FIG. 7 is a circuit diagram illustrating an example of a pulse latch included in the domino circuit of FIG. 4.

FIG. 7 is a circuit diagram illustrating an example of a pulse latch 290a included in the domino circuit 200 of FIG. 4.

Referring to FIG. 7, the pulse latch 290a may include a first inverter 291, a second inverter 292, a third inverter 293, and a fourth inverter 294. If the domino circuit 200 of FIG. 4 includes the pulse latch 290a of FIG. 7, the inverter 284 included in the last-stage dynamic unit 280 may be substituted with the first inverter 291 included in the pulse latch 290a.

The first inverter 291 may be a tri-state inverter. The first inverter 291 may receive the output signal OUT8 of the last-stage dynamic unit 280 as a latch input signal LI and may perform a switching operation in response to the pulse signal P.

The second and third inverters 292 and 293 are implemented with the latch circuit, where inputs and outputs of the second and third inverters 292 and 293 are cross-coupled. An output terminal of the second inverter 292 is coupled to an input terminal of the third inverter 293 at a first latch node LN1 that receives an output signal of the first inverter 291. An input terminal of the second inverter 292 is coupled to an output terminal of the third inverter 293 at a second latch node LN2. The first latch node LN1 may be referred to as a latch node and the second latch node LN2 may be referred to as an inverted latch node. The fourth inverter 294 inverts a signal at the first latch node LN1 and provides the output signal Q. The fourth inverter 294 may also amplify the signal at the first latch node LN1 to output the amplified signal as the output signal Q, and thus fourth inverter 294 may operate as a buffer or a driver.

Figure 8:
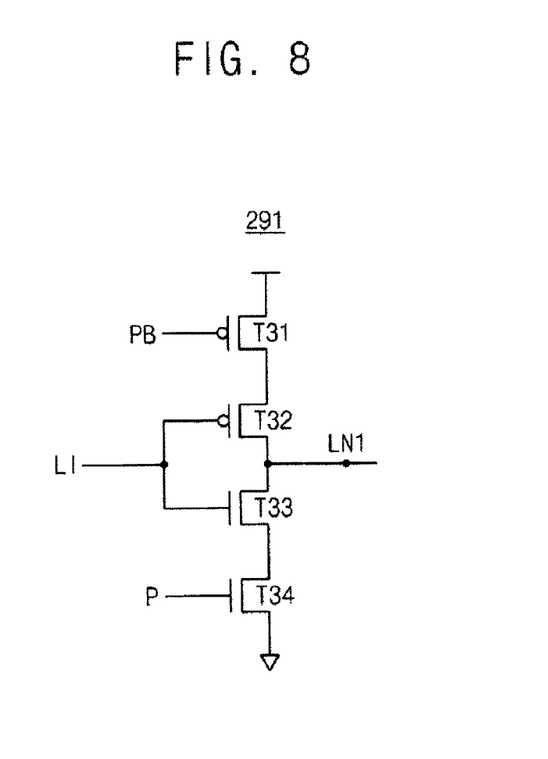
FIG. 8 is a circuit diagram illustrating an example of a tri-state inverter included in the pulse latch of FIG. 7.

FIG. 8 is a circuit diagram illustrating an example of a tri-state inverter 291 included in the pulse latch 290a of FIG. 7.

The first inverter 291 of FIG. 7 may receive the latch input signal LI to output an inversion signal of the latch input signal LI to the first latch node LN1 and may be implemented with the tri-state inverter, as illustrated in FIG. 8.

Referring to FIG. 8, the first inverter 291 may include a first transistor T31, a second transistor T32, a third transistor T33, and a fourth transistor T34. The first, second, third, and fourth transistors T31, T32, T33, and T34 are connected in series between a source voltage and a ground voltage. A gate of the second transistor T32 and a gate of the third transistor T33 receive the latch input signal LI. The second transistor T32 and the third transistor T33 may operate as an inverter. A gate of the first transistor T31 receives the inversion signal PB of the pulse signal P and a gate of the fourth transistor T34 receives the pulse signal P. The first and fourth transistors T31 and T34 are turned on at a rising edge of the pulse signal P, and the first latch node LN1 receives the inversion signal of the latch input signal LI.

As such, the pulse latch 290a of FIG. 7 may latch the output signal OUT8 of the last-stage dynamic unit 280 in response to the pulses P1 and P2 of the pulse signal P by using the tri-state inverter 291, and thus the pulse latch 290a may provide the output signal Q in synchronization with the pulse signal P.

Figure 9:
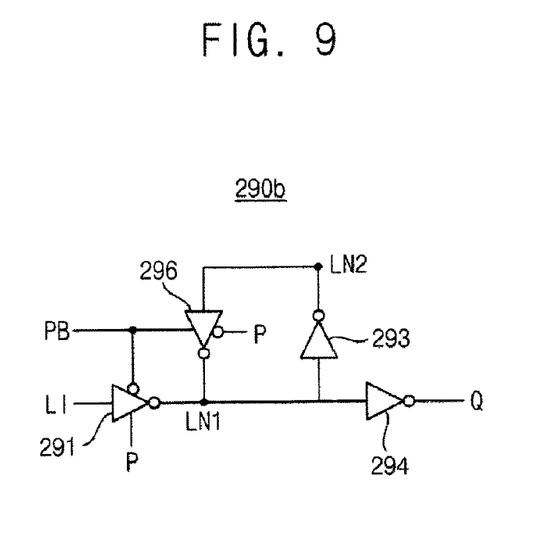
FIG. 9 is a circuit diagram illustrating another example of a pulse latch included in the domino circuit of FIG. 4.

FIG. 9 is a circuit diagram illustrating another example of a pulse latch 290b included in the domino circuit 200 of FIG. 4.

Referring to FIG. 9, the pulse latch 290b may include a first inverter 291, a second inverter 296, a third inverter 293 and a fourth inverter 294. If the domino circuit 200 of FIG. 4 includes the pulse latch 290b of FIG. 9, the inverter 284 included in the last-stage dynamic unit 280 may be substituted with the first inverter 291 included in the pulse latch 290b.

Compared to the pulse latch 290a of FIG. 7, the pulse latch 290b of FIG. 9 includes the second inverter 296 that is implemented with the tri-state inverter.

The first inverter 291 may be a tri-state inverter. The first inverter 291 may receive the output signal OUT8 of the last-stage dynamic unit 280 as a latch input signal LI and may perform a switching operation in response to the pulse signal P. Operations and configurations of the second inverter 296 will be described later with reference to FIG. 10.

Figure 10:
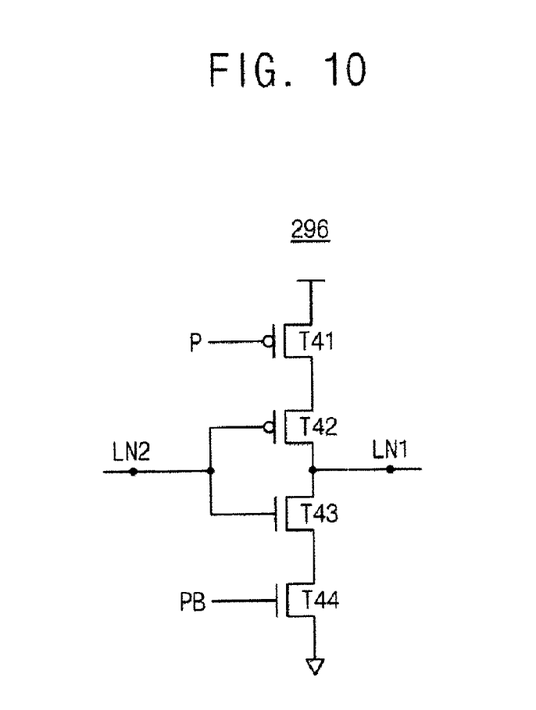
FIG. 10 is a circuit diagram illustrating an example of a tri-state inverter included in the pulse latch of FIG. 9.

FIG. 10 is a circuit diagram illustrating an example of a tri-state inverter 296 included in the pulse latch 290b of FIG. 9.

The second inverter 296 of FIG. 9 may invert a signal at the second latch node LN2 to output the inversion signal of the signal at the second latch node LN2 to the first latch node LN1 and may be implemented with the tri-state inverter, as illustrated in FIG. 10.

Referring to FIG. 10, the second inverter 296 may include a first transistor T41, a second transistor T42, a third transistor T43 and a fourth transistor T44. The first, second, third and fourth transistors T41, T42, T43 and T44 are connected in series between the source voltage and the ground voltage. A gate of the second transistor T42 and a gate of the third transistor T43 receive the signal at the second latch node LN2. The second transistor T42 and the third transistor T43 may operate as an inverter. A gate of the first transistor T41 receives the pulse signal P and a gate of the fourth transistor T44 receives the inversion signal PB of the pulse signal P.

In the second inverter 296 of FIG. 10, the first and fourth transistors T41 and T44 are turned off at a rising edge of the pulse signal P and the first latch node LN1 is floated. The second inverter 296 may turned off at a time point which the first inverter 291 transmits the inversion signal of the latch input signal LI to the first latch node LN1 and the pulse latch 290b may interrupt influences of the signal at the second latch node LN2. Thus, the signal at the first latch node LN1 is rapidly stabilized.

Figure 11:
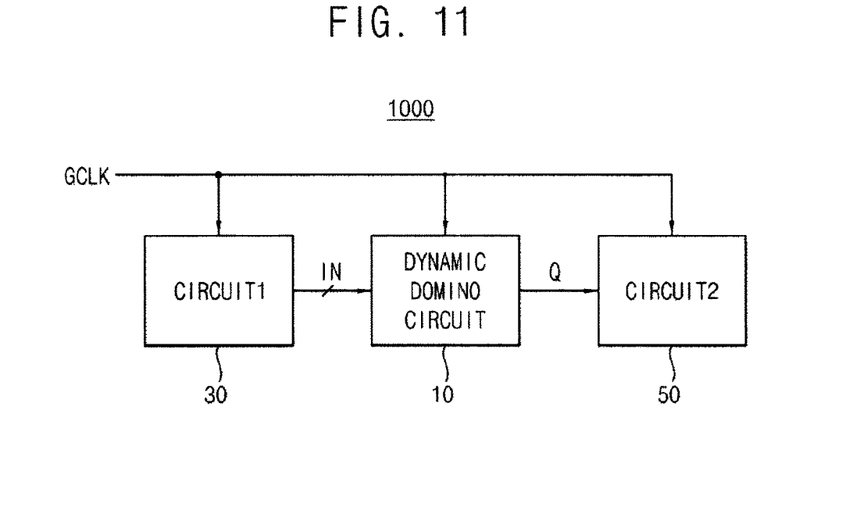
FIG. 11 is a block diagram illustrating an integrated circuit including a dynamic domino circuit according to some example embodiments.

FIG. 11 is a block diagram illustrating an integrated circuit 1000 including a dynamic domino circuit 10 according to some example embodiments.

Referring to FIG. 11, the integrated circuit 1000 includes a first circuit 30, the dynamic domino circuit 10, and a second circuit 50.

The dynamic domino circuit 10, the first circuit 30, and the second circuit 50 may receive a global clock signal GCLK. The global clock signal GCLK may be a clock signal that is commonly used in the dynamic domino circuit 10, the first circuit 30, and the second circuit 50 for mutual synchronization.

As described with reference to FIGS. 1 through 10, the dynamic domino circuit 10 may include the clock generator 100 and the domino circuit 200. The clock generator 100 generates the pulse signal P and the plurality of internal clock signals CK based on the global clock signal GCLK. The phases of the internal clock signals CK are sequentially delayed. The domino circuit 200 sequentially performs the plurality of logic operations based on the plurality of input signals IN, the pulse signal P, and the internal clock signals CK and generates the output signal Q in synchronization with the pulse signal P.

For example, the plurality of input signals IN transmitted from the first circuit 30 to the dynamic domino circuit 10 may be static signals. The output signal Q may be the static signal and may be provided to the second circuit 50. As described above, the dynamic domino circuit 10 may internally perform the logic operations, may internally transmit the dynamic signals from a first internal unit to a last internal unit, and may perform the input operation and/or the output operation in relation with the first and second circuits 30 and 50. Thus, the dynamic domino circuit 10 may provide the effective interface with the static logic circuits, such as the first and second circuits 30 and 50.

Figure 12:
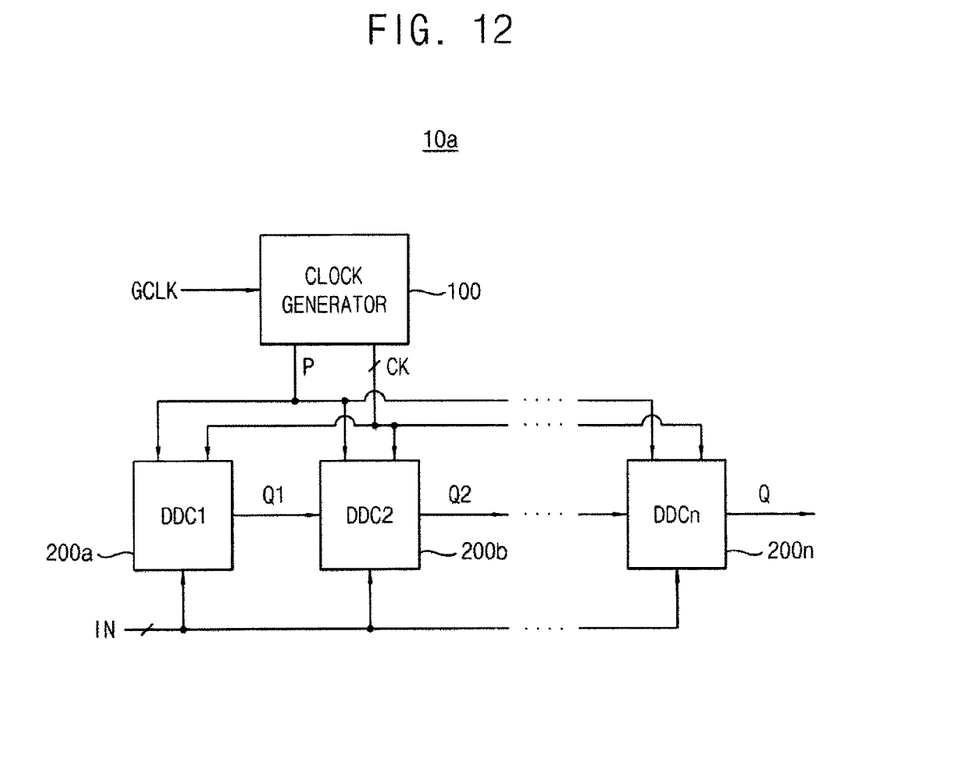
FIG. 12 is a block diagram illustrating a dynamic domino circuit according to other example embodiments of the present general inventive concept.

FIG. 12 is a block diagram illustrating a dynamic domino circuit 10a according to other example embodiments.

Referring to FIG. 12, dynamic domino circuit 10a may include a clock generator 100 and a plurality of domino circuits 200a, 200b, . . . , 200n.

The clock generator 100 generates a pulse signal P and a plurality of internal clock signals CK based on a global clock signal GCLK. The phases of the internal clock signals CK are sequentially delayed. The plurality of domino circuits 200a through 200n commonly receives a plurality of input signals IN and commonly receives the pulse signal P and the internal clock signals CK from the clock generator 100.

The plurality of domino circuits 200a through 200n sequentially performs a plurality of logic operations based on the plurality of input signals IN, the pulse signal P, and the internal clock signals CK, and generates the final output signal Q in synchronization with the pulse signal P. For example, each of domino circuits 200a through 200n may perform an input operation, the sequentially logic operations, a transmission operation, and an output operation in synchronization with the pulse signal P. The input operation, the sequentially logic operations, the transmission operation, and the output operation may be performed within the single clock period of the global clock signal GCLK.

The dynamic domino circuit according to the example embodiments includes the following features.

The first dynamic unit 210 included in the domino circuit 200 may estimate the result of the logic operation in response to the pulse signal P, instead of the first internal clock signal CK1, to capture a static input signal at a time point of an edge of the clock signal.

The dynamic domino circuit according to the example embodiments may further include the pulse latch to provide an output signal in a same form of an output signal of a typical static logic to the next-stage static logic. According to the features as described above, the dynamic domino circuit according to the example embodiments may provide an effective interface with the static logics, to thereby increase operation speed of the integrated circuit including the dynamic domino circuit.

In addition, as integrated circuits are fabricated with more precise manufacturing processes, the OCV related with manufacturing processes may have major influence on the operation of the dynamic domino circuit. Thus, in dynamic domino circuit according to the example embodiments, the phase overlap time interval of the internal clock signals CK1, CK2, and CK3 may be increased to about a half of the clock period T of the internal clock signals. The dynamic domino circuit may effectively control the phases and duty ratios of the internal clock signals, to thereby prevent erroneous operations and improve the reliability thereof.

In the domino circuit 200 included in the dynamic domino circuit 10, the low threshold-voltage transistor irrelevant to high speed operation may be substituted with the regular threshold-voltage transistor or the high threshold-voltage transistor, to thereby reduce leakage current and power consumption.

As described above, the dynamic domino circuit according to the example embodiments may be used to the integrated circuit that includes the static circuits being merged with the dynamic circuits. The dynamic domino circuit and the integrated circuit according to the example embodiments may be also used to a portable device or system that is required for high speed operation and low power consumption.

While the example embodiments of the present general inventive concept and their advantages have been described in detail, it should be understood that various changes, substitutions and alterations may be made herein without departing from the scope of the general inventive concept.

Although a few embodiments of the present general inventive concept have been shown and described, it would be appreciated by those skilled in the art that changes may be made in these embodiments without departing from the principles and spirit of the general inventive concept, the scope of which is defined in the claims and their equivalents.

What is claimed is:

1. A dynamic domino circuit comprising:
   a clock generator configured to generate a pulse signal and a plurality of internal clock signals based on a global clock signal, phases of the plurality of internal clock signals being sequentially delayed; and
   a domino circuit configured to sequentially perform a plurality of logic operations based on a plurality of input signals, the pulse signal, and the plurality of internal clock signals and configured to generate an output signal in synchronization with the pulse signal.

2. The dynamic domino circuit of claim 1, wherein each of duty ratios of the plurality of internal clock signals is greater than about 0.5.

3. The dynamic domino circuit of claim 1, wherein the domino circuit includes a plurality of dynamic units cascade-coupled from a first-stage dynamic unit to a last-stage dynamic unit, each of the plurality of dynamic units performing a respective logic operation based on an output signal of a previous-stage dynamic unit and outputting a result of the logic operation to a next-stage dynamic unit, and
   wherein a dynamic unit located at a later stage receives an internal clock signal having a phase with a greater delay than a dynamic unit located at an earlier stage of the dynamic domino circuit.

4. The dynamic domino circuit of claim 3, wherein the first-stage dynamic unit outputs the result of the logic operation to a second-stage dynamic unit in synchronization with the pulse signal.

5. The dynamic domino circuit of claim 3, further comprising:
   a pulse latch configured to latch an output signal of the last-stage dynamic unit in synchronization with the pulse signal to generate the output signal in synchronization with the pulse signal.

6. The dynamic domino circuit of claim 5, wherein the pulse latch includes:
   a tri-state inverter configured to receive the output signal of the last-stage dynamic unit and configured to perform a switching operation in response to the pulse signal.

7. The dynamic domino circuit of claim 3, wherein each of the plurality of dynamic units comprises:
   a pre-charge transistor connected between a source voltage and a first node;
   a discharge transistor connected between a ground voltage and a second node; and
   a logic unit connected between the first node and the second node.

8. The dynamic domino circuit of claim 7, wherein the logic unit includes a plurality of low threshold-voltage transistors to perform a switching operation at a relatively high speed, and
   the pre-charge transistor and the discharge transistor have a threshold voltage higher than a threshold voltage of the low threshold-voltage transistor to reduce a leakage current.

9. The dynamic domino circuit of claim 3, wherein the first-stage dynamic unit includes a first pre-charge transistor, a first discharge transistor, and a first logic unit and outputs the result of the logic operation of the first logic unit in synchronization with the pulse signal that is applied to a gate of the first discharge transistor.

10. The dynamic domino circuit of claim 1, wherein the clock generator includes:
    a delay-inversion unit configured to generate an inverted clock signal by inverting the global clock signal, a delayed-inverted clock signal by delaying the inverted clock signal, and a delayed clock signal by inverting the delayed-inverted clock signal; and
    a clock output unit configured to perform the logic operation on the inverted clock signal, the delayed-inverted clock signal, and the delayed clock signal to generate the pulse signal and the plurality of internal clock signals.

11. The dynamic domino circuit of claim 10, wherein the clock output unit includes:
    a first unit configured to perform an AND operation on the global clock signal and the delayed-inverted clock signal to generate the pulse signal;
    a second unit configured to perform an OR operation on the global clock signal and the delayed clock signal to generate a first internal clock signal;
    a third unit configured to perform the OR operation on the inverted clock signal and the delayed clock signal to generate a second internal clock signal; and a fourth unit configured to perform the OR operation on the inverted clock signal and the delayed-inverted clock signal to generate a third internal clock signal.

12. An integrated circuit comprising:
a first circuit configured to receive a global clock signal and configured to provide a plurality of input signals;
a dynamic domino circuit configured to generate a pulse signal and a plurality of internal clock signals based on the global clock signal, to sequentially perform a plurality of logic operations based on the plurality of input signals, the pulse signal, and the plurality of internal clock signals, and to generate an output signal in synchronization with the pulse signal, phases of the plurality of internal clock signals being sequentially delayed; and
a second circuit configured to receive the global clock signal and the output signal in synchronization with the pulse signal.

13. The integrated circuit of claim 12, wherein the dynamic domino circuit includes:
a clock generator configured to generate the pulse signal and the plurality of internal clock signals based on the global clock signal; and
a domino circuit configured to sequentially perform the plurality of logic operations based on the plurality of input signals, the pulse signal, and the plurality of internal clock signals and configured to generate the output signal in synchronization with the pulse signal.

14. A dynamic domino circuit, comprising:
a clock generator to receive a global clock signal and to output a pulse signal and a plurality of internal clock signals, the internal clock signals having phases different from each other; and
a domino circuit including a plurality of logic units connected in series, such that each logic unit receives as an input signal an output from an immediately-preceding logic unit in the domino circuit, and a logic operation of each logic unit is performed according to a respective internal clock signal or the pulse signal supplied to the respective logic unit.

15. The dynamic domino circuit according to claim 14, wherein a first logic unit located upstream in the domino circuit with respect to a second logic unit receives an internal clock signal of the plurality of internal clock signals having a phase having a delay less than that of an internal clock signal supplied to the second logic unit.

16. The dynamic domino circuit according to claim 15, wherein the clock generator comprises:
at least one delay circuit to receive a first clock signal corresponding to the global clock signal and to output a second clock signal having a phase delay with respect to the first signal,
wherein the internal clock signal supplied to the first logic unit corresponds to the first clock signal, and
the internal clock signal supplied to the second logic unit corresponds to the second clock signal.

17. The dynamic domino circuit according to claim 16, wherein the clock generator further comprises:
a first inverter to receive the global clock signal and to output an inverted clock signal as the first clock signal; and
a second inverter to receive the second clock signal and to output a third clock signal,
wherein internal clock signals corresponding to the first, second, and third clock signals are supplied to respective logic units of the dynamic domino circuit, such that an internal clock signal corresponding to the third clock signal is supplied to a logic unit downstream of the second logic unit in the dynamic domino circuit.

18. The dynamic domino circuit according to claim 17, further comprising:
a clock output unit to receive the global clock signal and the first, second, and third clock signals and to output the pulse signal and the plurality of internal clock signals.

19. The dynamic domino circuit according to claim 14, wherein an output of the last logic unit of the plurality of logic units connected in series is synchronized with the pulse signal.

20. The dynamic domino circuit according to claim 19, further comprising:
a latch circuit to latch the output of the last logic unit of the plurality of logic units to the output of the latch in synchronization with the pulse signal.

\* \* \* \* \*

UNITED STATES PATENT AND TRADEMARK OFFICE
CERTIFICATE OF CORRECTION

PATENT NO. : 7,932,750 B2  Page 1 of 1
APPLICATION NO. : 12/769000
DATED : April 26, 2011
INVENTOR(S) : Min-Su Kim It is certified that error appears in the above-identified patent and that said Letters Patent is hereby corrected as shown below:

On the Title Page, please insert:

Item -- (30) Foreign Application Priority Data
June 16, 2009 (KR)........10-2009-0053307 --

Signed and Sealed this
First Day of May, 2012

David J. Kappos
*Director of the United States Patent and Trademark Office*